(12) United States Patent
Kim et al.

(10) Patent No.: US 8,824,163 B2
(45) Date of Patent: Sep. 2, 2014

(54) RF LAYERED MODULE USING THREE DIMENSIONAL VERTICAL WIRING AND DISPOSING METHOD THEREOF

(75) Inventors: Young Il Kim, Suwon-si (KR); In Sang Song, Osan-si (KR); Duck Hwan Kim, Goyang-si (KR); Chul Soo Kim, Hwaseong-si (KR); Yun Kwon Park, Dongducheon Si (KR); Jea Shik Shin, Hwaseong-si (KR); Hyung Rak Kim, Seoul (KR); Jae Chun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 223 days.

(21) Appl. No.: 13/217,371

(22) Filed: Aug. 25, 2011

(65) Prior Publication Data

US 2012/0063106 A1 Mar. 15, 2012

(30) Foreign Application Priority Data

Sep. 15, 2010 (KR) .................... 10-2010-0090811

(51) Int. Cl.
*H05K 1/18* (2006.01)
*H01L 25/065* (2006.01)
*H01L 25/16* (2006.01)
*H01L 23/66* (2006.01)
*H01L 23/13* (2006.01)
*H01L 23/538* (2006.01)

(52) U.S. Cl.
CPC ....... *H01L 23/66* (2013.01); *H01L 2224/48227* (2013.01); *H01L 2924/01322* (2013.01); *H01L 25/0652* (2013.01); *H01L 25/16* (2013.01); *H01L 2225/0652* (2013.01); *H01L 2924/3011* (2013.01); *H01L 23/13* (2013.01); *H01L 25/0657* (2013.01); *H01L 2224/16225* (2013.01); *H01L 2223/6616* (2013.01); *H01L 2225/06572* (2013.01); *H01L 23/5385* (2013.01); *H01L 2225/06548* (2013.01); *H01L 2924/15311* (2013.01)
USPC ........... 361/792; 361/728; 361/761; 361/800; 257/40; 257/528; 257/659; 257/678; 257/686; 257/690; 257/737; 257/738; 438/55; 438/107; 438/108; 438/109; 333/133; 333/189

(58) Field of Classification Search
CPC ...... H01K 1/18; H01K 13/0023; H01L 21/00; H01L 23/48; H01L 23/49; H01L 23/52; H01L 23/55; H01L 23/58; H01L 39/00
USPC ............ 361/792, 728, 761, 800; 257/40, 528, 257/659, 678, 686, 690, 737, 738; 438/55, 438/107, 108, 109; 333/133, 189
See application file for complete search history.

(56) References Cited

U.S. PATENT DOCUMENTS 4,658,334 A * 4/1987 McSparran et al. .......... 361/800
6,304,309 B1 * 10/2001 Yamanaka et al. ............ 349/156
(Continued)

FOREIGN PATENT DOCUMENTS

JP 07-297359 11/1995
JP 2001-185984 7/2001
(Continued)

*Primary Examiner* — Xiaoliang Chen
(74) *Attorney, Agent, or Firm* — NSIP Law

(57) ABSTRACT

Provided is a structure and disposing method of a radio frequency (RF) layered module using three dimensional (3D) vertical wiring. A first wafer in the RF layered module having the 3D vertical wiring may include a first RF device and at least one first via-hole. A second wafer may include a second RF device and at least one second via-hole disposed at a location corresponding to the at least one first via-hole. A vertical wiring may connect the at least one first via-hole and the at least one second via-hole. The vertical wiring may be configured to be connected to an external device through a bottom surface of the at least one first via-hole or a top surface of the at least one second via-hole.

10 Claims, 7 Drawing Sheets

(56) References Cited

U.S. PATENT DOCUMENTS

| | | | |
|---|---|---|---|
| 6,456,172 B1* | 9/2002 | Ishizaki et al. | 333/133 |
| 6,734,539 B2 | 5/2004 | Degani et al. | |
| 6,986,199 B2* | 1/2006 | Arnold et al. | 29/832 |
| 7,042,086 B2* | 5/2006 | Shimoida et al. | 257/724 |
| 7,164,199 B2* | 1/2007 | Tarn | 257/705 |
| 7,982,296 B2* | 7/2011 | Nuzzo et al. | 257/679 |
| 8,021,907 B2* | 9/2011 | Pagaila et al. | 438/55 |
| 8,039,306 B2* | 10/2011 | Baleras et al. | 438/107 |
| 8,222,079 B2* | 7/2012 | Knickerbocker et al. | 438/108 |
| 8,334,170 B2* | 12/2012 | Wang et al. | 438/109 |
| 8,558,985 B2* | 10/2013 | Nystrom et al. | 349/193 |
| 2001/0023980 A1* | 9/2001 | Ohmori | 257/678 |
| 2002/0064906 A1* | 5/2002 | Enquist | 438/109 |
| 2002/0135720 A1* | 9/2002 | Yamanaka et al. | 349/122 |
| 2003/0020173 A1* | 1/2003 | Huff et al. | 257/774 |
| 2003/0230798 A1* | 12/2003 | Lin et al. | 257/704 |
| 2004/0016995 A1* | 1/2004 | Kuo et al. | 257/678 |
| 2004/0091719 A1* | 5/2004 | Uchida | 428/429 |
| 2004/0178488 A1* | 9/2004 | Bolken et al. | 257/686 |
| 2004/0201012 A1* | 10/2004 | Faris | 257/40 |
| 2004/0247236 A1* | 12/2004 | Yoshimura et al. | 385/16 |
| 2004/0262645 A1* | 12/2004 | Huff et al. | 257/232 |
| 2005/0156319 A1* | 7/2005 | Oggioni et al. | 257/774 |
| 2005/0161753 A1* | 7/2005 | Huff et al. | 257/431 |
| 2005/0167047 A1* | 8/2005 | Huff et al. | 156/345.1 |
| 2005/0245001 A1* | 11/2005 | Hyvonen et al. | 438/107 |
| 2006/0012037 A1* | 1/2006 | Raedt et al. | 257/737 |
| 2006/0018588 A1* | 1/2006 | Uchida | 385/14 |
| 2006/0121690 A1* | 6/2006 | Pogge et al. | 438/455 |
| 2006/0197194 A1* | 9/2006 | Arnold et al. | 257/665 |
| 2006/0261432 A1* | 11/2006 | Yoshimura et al. | 257/462 |
| 2007/0080457 A1* | 4/2007 | Tanida et al. | 257/739 |
| 2007/0170565 A1* | 7/2007 | Hong et al. | 257/678 |
| 2007/0182012 A1* | 8/2007 | DeRaedt et al. | 257/738 |
| 2008/0012451 A1* | 1/2008 | Mizumura et al. | 310/346 |
| 2008/0185708 A1* | 8/2008 | Chen et al. | 257/698 |
| 2008/0186690 A1* | 8/2008 | Miettinen et al. | 361/761 |
| 2008/0258293 A1* | 10/2008 | Yang et al. | 257/701 |
| 2008/0315375 A1* | 12/2008 | Eichelberger et al. | 257/659 |
| 2008/0315388 A1* | 12/2008 | Periaman et al. | 257/690 |
| 2008/0316714 A1* | 12/2008 | Eichelberger et al. | 361/728 |
| 2008/0316727 A1* | 12/2008 | Val et al. | 361/793 |
| 2009/0002316 A1* | 1/2009 | Rofougaran | 345/156 |
| 2009/0091903 A1* | 4/2009 | Hsu et al. | 361/761 |
| 2009/0111213 A1* | 4/2009 | Chang et al. | 438/108 |
| 2009/0236686 A1* | 9/2009 | Shim et al. | 257/528 |
| 2009/0302435 A1* | 12/2009 | Pagaila et al. | 257/659 |
| 2010/0019368 A1* | 1/2010 | Shin | 257/686 |
| 2010/0019370 A1* | 1/2010 | Pressel et al. | 257/690 |
| 2010/0078635 A1* | 4/2010 | Kuroda et al. | 257/48 |
| 2010/0148316 A1* | 6/2010 | Kim et al. | 257/621 |
| 2011/0108973 A1* | 5/2011 | Hsieh et al. | 257/686 |
| 2011/0278741 A1* | 11/2011 | Chua et al. | 257/777 |
| 2011/0291267 A1* | 12/2011 | Wang et al. | 257/737 |
| 2011/0291268 A1* | 12/2011 | Wang et al. | 257/737 |
| 2012/0049978 A1* | 3/2012 | Pang et al. | 333/189 |

FOREIGN PATENT DOCUMENTS

| | | |
|---|---|---|
| JP | 2006-024744 | 1/2006 |
| JP | 2007-214566 | 8/2007 |
| JP | 2007-294832 | 11/2007 |
| KR | 10-2006-0050604 | 5/2006 |

* cited by examiner

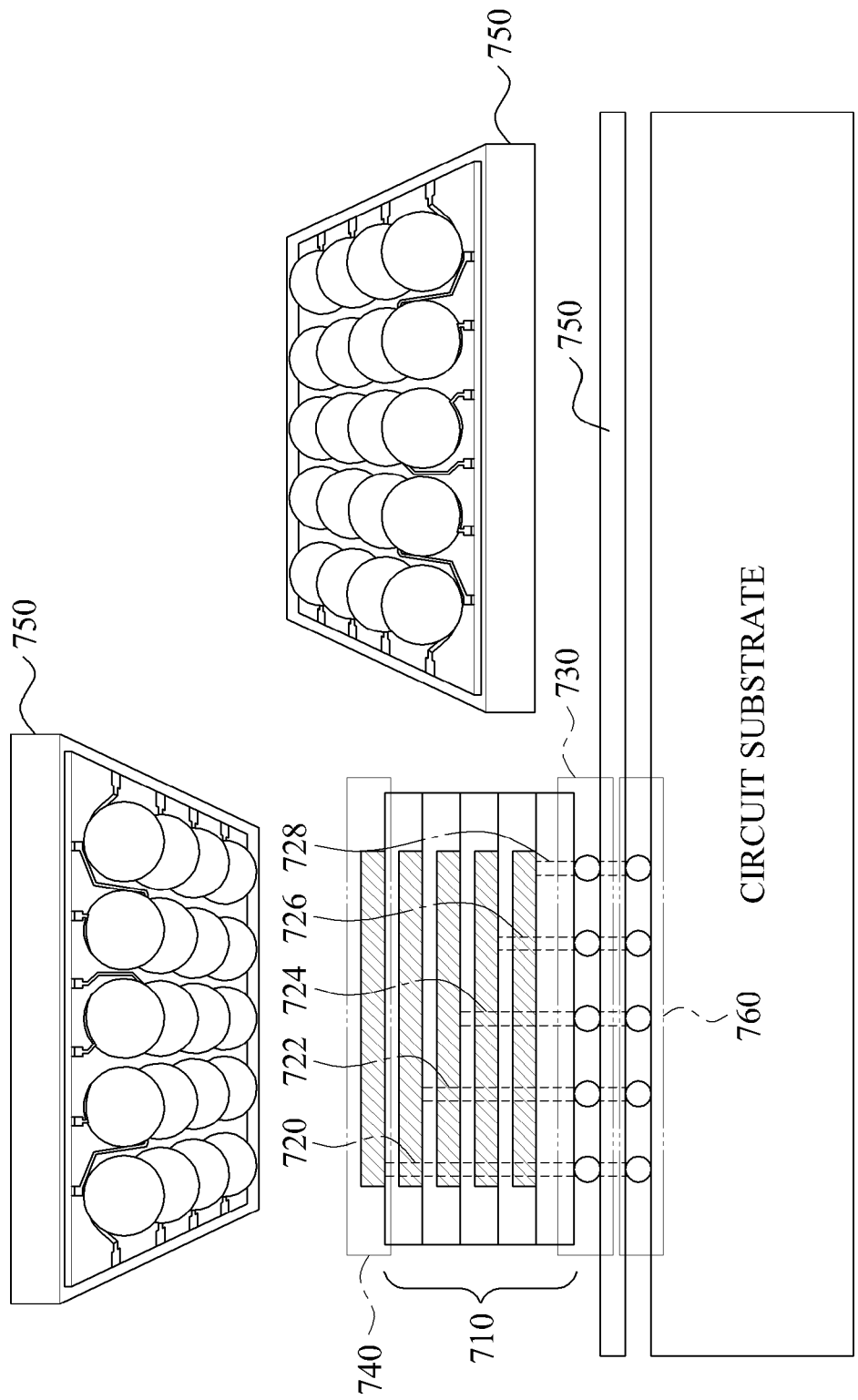

RF LAYERED MODULE USING THREE DIMENSIONAL VERTICAL WIRING AND DISPOSING METHOD THEREOF

CROSS-REFERENCE TO RELATED APPLICATION(S)

This application claims the benefit under 35 U.S.C. §119(a) of Korean Patent Application No. 10-2010-0090811, filed on Sep. 15, 2010, in the Korean Intellectual Property Office, the entire disclosure of which is incorporated herein by reference for all purposes.

BACKGROUND

1. Field

The following description relates to a structure of a radio frequency (RF) module and a disposing method thereof.

2. Description of Related Art

Various frequency bands, such as high frequency (HF), very high frequency (VHF), ultrahigh frequency (UHF), etc., are used in various forms of communication. To use each frequency band available to a terminal, a filter capable of detecting each frequency band may be provided in the terminal. Conventional terminals typically detect a single frequency band. However, due to current developments in communication technologies, recently released terminals may be able to utilize various frequency bands. Accordingly, a filter capable of detecting various frequency bands may be provided in the terminal.

The filter of the terminal may be configured using a radio frequency (RF) module, and conventional RF modules may have an essentially two-dimensional (2D) flat structure. However, the 2D structure may not be suitable for a high integration and miniaturization. Accordingly, there is a desire for a scheme of maximizing space usage efficiency, and minimizing a parasitic loss occurring in a device and wiring.

SUMMARY

In one general aspect, there is provided a system including a radio frequency (RF) layered module using three dimensional (3D) vertical wiring, including a first wafer provided with a first RF device and at least one first via-hole, a second wafer provided with a second RF device and at least one second via-hole disposed at a location corresponding to the at least one first via-hole, a vertical wiring connecting the at least one first via-hole and the at least one second via-hole, and a penetrating electrode configured to be connected to an external device through a bottom surface of the at least one first via-hole or a top surface of the at least one second via-hole.

The RF layered module may further include a first electrode connecting the at least one first via-hole and the first RF device.

A top surface of the first wafer may have a flat structure, and the first RF device may be disposed on the top surface of the first wafer.

A top surface of the first wafer may have a cavity formed in a predetermined portion, and the first RF device may be disposed in the cavity.

A top surface and a bottom surface of the first wafer may each have a cavity formed in a predetermined portion, and the first RF device may be disposed in the cavity formed on the top surface.

A top surface and a bottom surface of the first wafer may each have a cavity formed in a predetermined portion, the first RF device may be disposed in the cavity formed on the top surface, and a third RF device may be disposed in the cavity formed on the bottom surface.

The first wafer may be provided with a plurality of RF devices performing different RF functions, and which may form multiple arrays on the first wafer.

The first wafer and the second wafer may be coupled using a eutectic bonding, a ball grid array bonding, a fusion bonding, a polymer bonding, or any combination thereof.

The RF layered module may further include a ball grid connecting the first RF device and the first electrode, and the first electrode may be disposed on a top side of the first wafer. The RF layered module may further include a wire connecting the first RF device and the first electrode, and the first electrode may be disposed on a top side of the first wafer.

In another general aspect, there is provided a multi-array RF layered module using 3D vertical wiring, including a first RF layered module configured to perform a function of a first RF device and a second RF device, a second RF layered module configured to perform a function of a third RF device and a fourth RF device, and a multi-array substrate connected to a bottom side of the first RF layered module and the second RF layered module, and including an inductor or a capacitor, wherein the first RF layered module includes a first wafer provided with the first RF device and at least one first via-hole, a second wafer provided with the second RF device and at least one second via-hole disposed at a location corresponding to the at least one first via-hole, a vertical wiring connecting the at least one first via-hole and the at least one second via-hole, and a penetrating electrode configured to be connected to a bottom surface of the at least one first via-hole or a top surface of the at least one second via-hole, and the second RF layered module includes a third wafer provided with the third RF device and at least one third via-hole, a fourth wafer provided with the fourth RF device and at least one fourth via-hole disposed at a location corresponding to the at least one third via-hole, a vertical wiring connecting the at least one third via-hole and the at least one fourth via-hole, and a penetrating electrode configured to be connected to a bottom surface of the at least one third via-hole or a top surface of the at least one fourth via-hole.

The first wafer may be provided with a plurality of RF devices performing different RF functions, and may form multiple arrays on the first wafer.

In another general aspect, there is provided a multi-array RF layered module using 3D vertical wiring, including a plurality of RF layered modules having the 3D vertical wiring, a multi-array substrate including the plurality of RF layered modules, a first connecting portion connecting the plurality of RF layered modules and the multi-array substrate, and a second connecting portion connecting the multi-array substrate and a circuit substrate including an inductor or a capacitor.

In another general aspect, there is provided an RF layered module disposing method using 3D vertical wiring, the method including layering a first RF device on a top side of a first wafer, the first wafer including at least one first via-hole, layering a second wafer including at least one second via-hole formed at a location corresponding to the at least one first via-hole on the top side of the first wafer, and layering a second RF device on a top side of the second wafer, connecting the at least one first via-hole and the at least one second via-hole, and forming a penetrating electrode to be connected to an external device through a bottom surface of the at least one first via-hole or a top surface of the at least one second via-hole.

The layering of the first RF device may include layering the first RF device on a flat top surface of the first wafer, and the layering of the second RF device may include layering the second RF device on a flat top surface of the second wafer.

The method may further include forming a first cavity by etching a top surface of the first wafer, and forming a second cavity by etching a top surface of the second wafer, wherein the layering of the first RF device may include layering the first RF device in the first cavity, and the layering of the second RF device may include layering the second RF device in the second cavity.

In another general aspect, there is provided a multi-array RF layered module disposing method using a 3D vertical wiring, including layering a first RF layered module and a second RF layered module on a top side of a multi-array substrate including an inductor or a capacitor to form multiple arrays, wherein the first RF layered module may be configured to perform a function of a first RF device and a second RF device and may be formed by layering a first wafer on the top side of the multi-array substrate, layering a first RF device on a top side of the first wafer, and forming at least one first via-hole proximate to the first RF device, layering a second wafer on the top side of the first wafer, layering a second RF device on a top side of the second wafer, and forming at least one second via-hole at a location corresponding to the at least one first via-hole, connecting the at least one first via-hole and the at least one second via-hole, and forming a penetrating electrode configured to be connected to an external device through a bottom surface of the at least one first via-hole or a top surface of the at least one second via-hole, and the second RF layered module may be configured to perform a function of a third RF device or a fourth RF device and may be formed by layering a third wafer on the top side of the multi-array substrate, layering a third RF device on a top side of the third wafer, and forming at least one third via-hole proximate to the third RF device, layering a fourth wafer on the top side of the third wafer, layering a fourth RF device on a top side of the fourth wafer, and forming at least one fourth via-hole at a location corresponding to the at least one third via-hole, connecting the at least one third via-hole and the at least one fourth via-hole, and forming a penetrating electrode configured to be connected to an external device through a bottom surface of the at least one third via-hole or a top surface of the at least one fourth via-hole.

In another general aspect, there is provided an RF layered module including a first wafer provided with at least one first RF device and at least one first via-hole, a second wafer provided with at lest one second RD device and at least one second via-hole corresponding to the at least one first via-hole, and vertical wiring connecting the at least one first via-hole and at least one second via-hole.

The at least one first RF device may be connected to the at least one first via-hole, and the at least one second RF device may be connected to the at least one second via-hole.

The first wafer may be provided with at least two first RF devices, including at least one of the at least two first RF devices on a first surface of the first wafer, and at least one of the at least two first RF devices on a second surface of the first wafer.

Since an RF layered module incorporating 3D vertical wiring may be used, a space may be efficiently used compared with the existing 2D flat structure.

Since an RF layered module incorporating 3D vertical wiring may be used, interference occurring between devices and wirings may be minimized.

Since an RF layered module incorporating 3D vertical wiring may be used, an RF module capable of detecting various frequencies may be disposed in a small-sized terminal.

Since 3D vertical wiring may be used, a wiring structure for device placement may be simplified, processes with reproducibility may be possible through simplification of the processes, and, thus, the cost of materials in the processes may be reduced.

Other features and aspects will be apparent from the following detailed description, the drawings, and the claims.

BRIEF DESCRIPTION OF THE DRAWINGS

FIG. 7 illustrates an example of a wiring connecting scheme among a plurality of RF layered modules, a multi-array substrate, and a circuit substrate, using a 3D vertical wiring.

Figure 1:
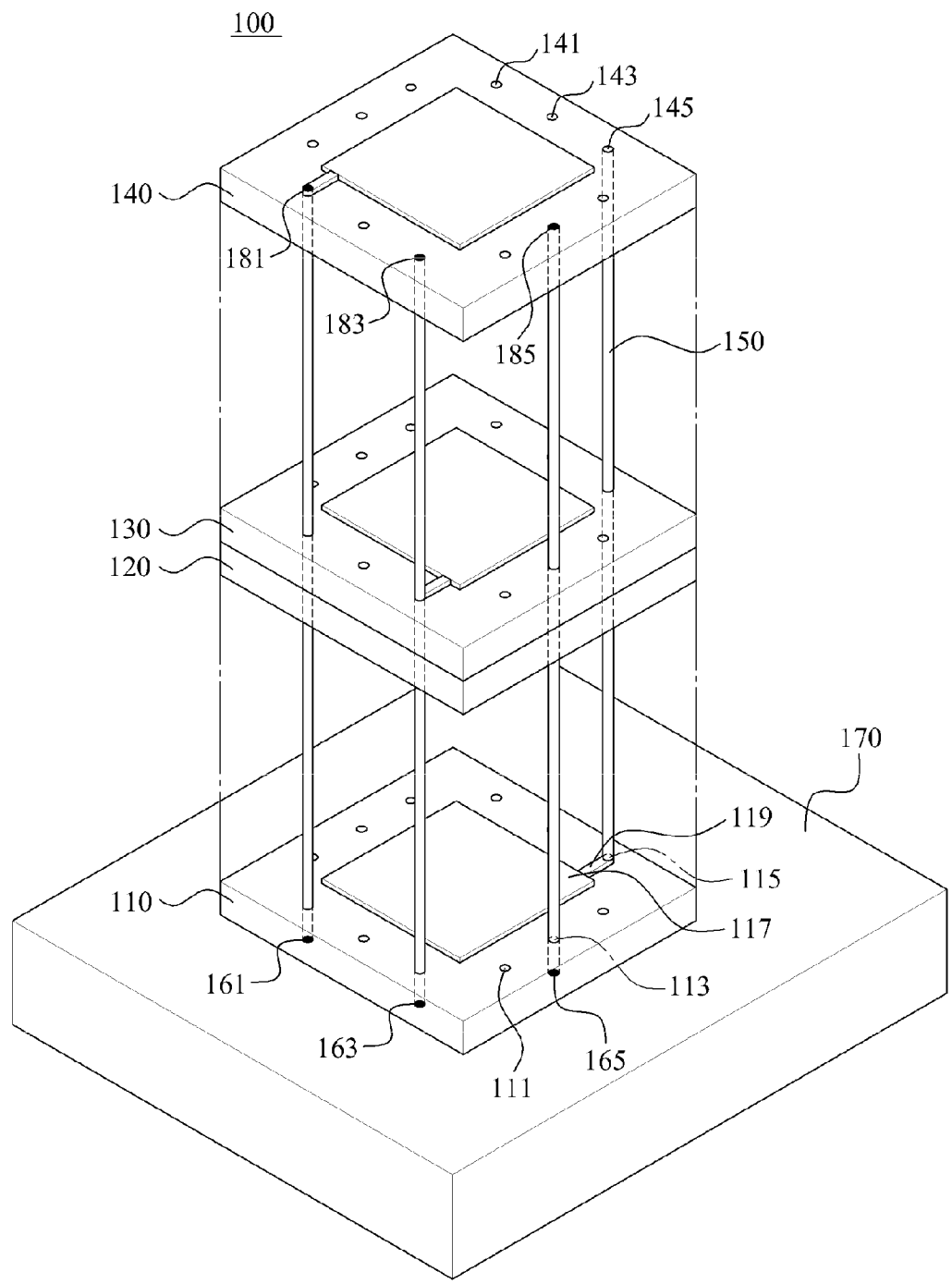
FIG. 1 illustrates an example of a structure of a radio frequency (RF) layered module using a three dimensional (3D) vertical wiring.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of operations described is an example; however, the sequence of operations is not limited to that set forth herein and may be changed as is known in the art, with the exception of operations necessarily occurring in a certain order. Also, description of well-known functions and constructions may be omitted for increased clarity and conciseness.

While the conventional RF modules have been previously described as having a 2D structure, relative to the 3D structure described in the following embodiments, it is understood that the 2D and 3D designations speak broadly to the directions of wiring of the RF modules, rather than a strict interpretation of the structural basis. More particularly, it is understood that the conventional RF modules are not perfectly flat two-dimensional structures, but rather are provided and wired in an essentially two-dimensional manner relative to the RF layered modules and/or RF devices using 3D wiring and multiple layers in the embodiments described below. In other words, 3D wiring refers to the vertical wiring through vertically provided layers in the examples described below, which is provided in addition to the conventional 2D wiring that exists in different directions in a single layer.

FIG. 1 illustrates an example of a structure of an RF layered module 100 using a 3D vertical wiring.

Referring to the example illustrated in FIG. 1, the RF layered module 100 using the 3D vertical wiring may include a first wafer 110, a second wafer 120, a third wafer 130, and an $N^{th}$ wafer 140. The RF layered module 100 using the 3D vertical wiring may include N layered wafers. While four layered wafers are illustrated in the example of FIG. 1, it is understood that this number of layered wafers is merely one example, and other numbers of layered wafers may be used.

Also, for ease of understanding of the structures and wiring of the RF layered module 100, the first wafer 110 and $N^{th}$ wafer 140 are extended from the second wafer 120 and third wafer 130 in the illustrated example of FIG. 1. In other words, in the actual configuration of the example illustrated in FIG. 1, the first wafer 110, second wafer 120, third wafer 130, and $N^{th}$ wafer 140 may be provided in an approximately adjacent manner.

The first wafer 110 may include at least one first via-hole, and a first RF device 117. For convenience of description, three examples of the at least one first via-hole are illustrated as first via-holes 111, 113, and 115 in FIG. 1. However, the possible number of first via-holes is not limited thereto. The first via-holes 111, 113, and 115 may be formed to connect an electrode between the layered wafers, and may be formed using, for example, a Through Si Via (TSV) scheme. The first via-holes 111, 113, and 115 may penetrate the entire wafer, or may partially penetrate a thickness of the wafer, and the remaining thickness of the wafer may be carved through. In this example, the wafer may be penetrated by using, for example, a deep reactive ion etching (DRIE) scheme. The first via-holes 111, 113, and 115 may be formed before the second wafer 120 is layered, or may be formed after the second wafer 120 is layered.

The second wafer 120 may include a second RF device and at least one second via-hole provided at a location corresponding to the at least one first via-hole of the first wafer 110, such as the first via-holes 111, 113, and 115 illustrated in FIG. 1. In this example, the at least one second via-hole may be formed at a location so as to be vertically connected to a corresponding first via-hole of the first wafer 110. The at least one second via-hole may include multiple second via-holes provided so as to be connected to the first via-holes 111, 113, and 115 so that one or more vertical wirings 150 may be formed in a layered structure in one or more corresponding pairings of the first and second via-holes. The first via-holes 111, 113, and 115 and the corresponding second via-holes connected by the vertical wirings 150 may be plated with a conductive material through a surface coating or a filling. The first RF device 117 may be connected to one or more of the first via-holes 111, 113, and 115 through an electrode 119 so as to be connected to at least one of the vertical wirings 150.

The third wafer 130 may include a third RF device and at least one third via-hole disposed at a location corresponding to the at least one second via-hole.

The $N^{th}$ wafer 140 may include an $N^{th}$ RF device and at least one $N^{th}$ via-hole disposed at a location corresponding to at least one $N-1^{th}$ via-hole. For convenience of description, three examples of the at least one $N^{th}$ via-hole are illustrated as $N^{th}$ via-holes 141, 143, and 145 in FIG. 1. However, the possible number of $N^{th}$ via-holes is not limited thereto. A via-hole may be formed proximate to an RF device on the wafer. In this example, a location of the via-hole may be set in consideration of interference between the RF device and a vertical wiring 150 formed through the via-hole.

The RF layered module 100 using the 3D vertical wiring may include a penetrating electrode 161, 163, and 165. The penetrating electrode 161, 163, and 165 may be provided at a bottom surface of at least one of the first via-holes 111, 113, and 115 included in the first wafer 110, and may perform a function of path transmitting and receiving a signal between an RF device located on each respective wafer and an external device. The penetrated electrode 161, 163, and 165 located on a bottom surface of the first wafer 110 of the RF layered modules 100 may be connected to a circuit substrate 170 by using the flip chip or ball grid array scheme. An external device may be connected to a circuit substrate 170. Similarly, the penetrating electrode 181, 183, and 185 may be provided at a top surface of at least one of the $N^{th}$ via-holes 141, 143, and 145 included in the $N^{th}$ wafer 140, and may perform the function of path transmitting and receiving the signal between the RF device located on each respective wafer and the external device.

The RF layered module 100 using the 3D vertical wiring may include N layered wafers including at least N RF devices. A layered wafer may include a via-hole, and an RF device located on each wafer may transmit and receive a signal with an external device using a wiring formed through the via-hole. The RF device may include, for example, a filter capable of filtering a signal having various frequency bands, a duplexer to divide a transmitting signal and a received signal in a transceiver, a phase shift network to control a phase of a signal and switch, and so on.

An RF layered module disposing method using the 3D vertical wiring may include layering the first RF device 117 on a top side of the first wafer 110 including the first via-holes 111, 113, and 115. The second wafer 120 including the at least one second via-hole, more particularly, the second via-holes formed at locations corresponding to the first via-holes 111, 113, and 115, may be layered above the top side of the first wafer 110, and the second RF device may be layered on a top side of the second wafer 120. The first via-holes 111, 113, and 115 and the corresponding second via-holes may be connected, and the penetrating electrode 161, 163, and 165 connected to the external device through the bottom surface of at least one of the first via-holes 111, 113, and 115 or the penetrating electrode 181, 183, and 185 connected to the external device through the top surface of at least one of the $N^{th}$ via-holes 141, 143, and 145 may be formed in a variety of ways.

Figure 2:
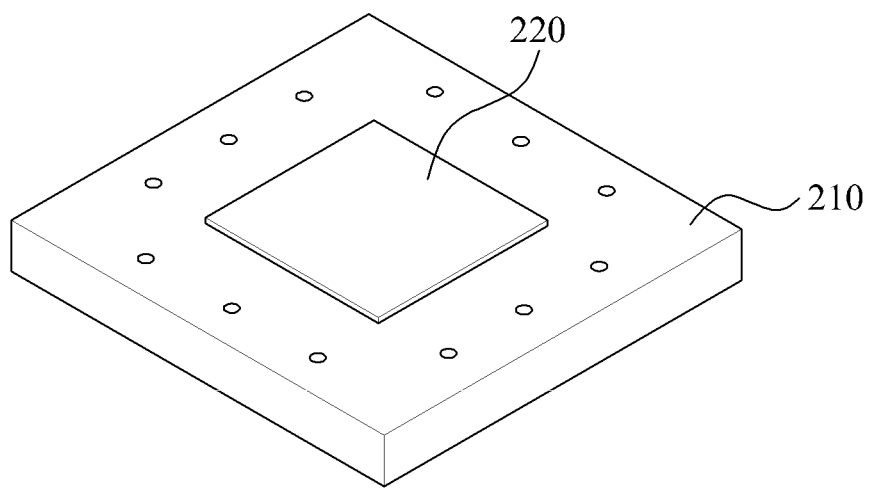
FIG. 2 illustrates an example of a structure of a wafer provided in an RF layered module using a 3D vertical wiring.
Figure 2:
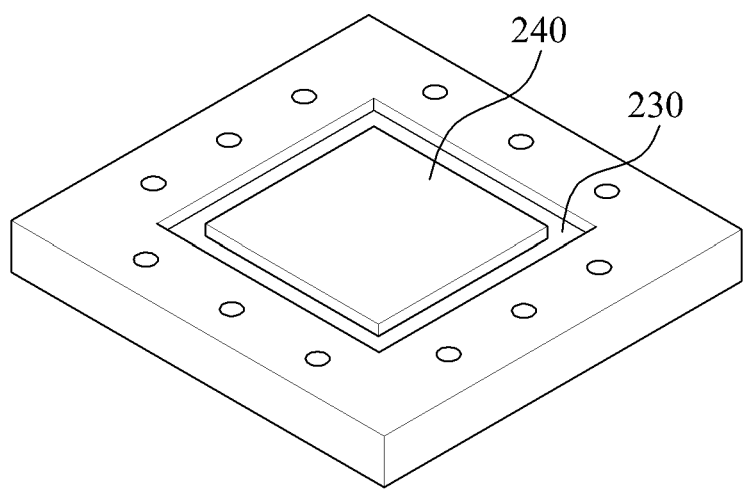

FIG. 2 illustrates an example of a structure of a wafer 210 disposed in an RF layered module using a 3D vertical wiring.

Referring to the example illustrated in FIG. 2, the structure of the wafer 210 disposed in the RF layered module using the 3D vertical wiring may be classified into a mesa structure and a cavity structure according to a location at which an RF device is provided to the wafer 210. The mesa structure may correspond to a structure in which an RF device 220 is disposed on a flat-top surface of the wafer 210. The RF device 220 may be connected to a via-hole formed on the wafer through an electrode, such as the electrode 119 illustrated in FIG. 1, and may perform the various functions of the RF device 117 previously described in regard to FIG. 1.

In the cavity structure, a cavity or groove 230 may be formed by, for example, etching a predetermined portion of the wafer 210 to a predetermined depth, and an RF device 240 may be provided in the formed cavity or groove 230. In an example in which a plurality of wafers are layered, the cavity structure may facilitate a layering of adjacent wafers by minimizing a space between wafers. The etching depth of the wafer having the cavity structure may be determined to correspond to a thickness of the RF device 240.

Although etching of the wafer has been described in various examples of the wafer having the cavity structure, it is understood that these examples are not limited to such a process, and other methods of forming the cavity may be performed.

Figure 3:
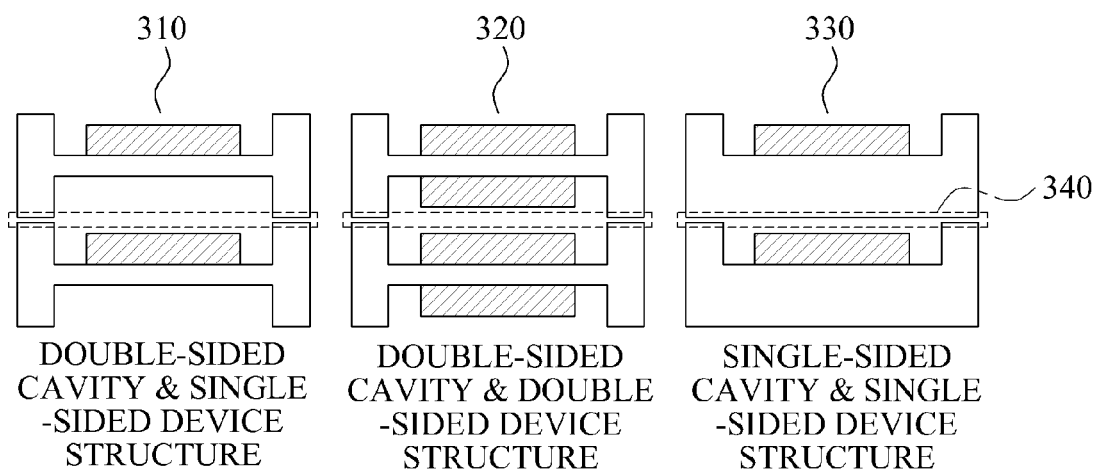
FIG. 3 illustrates an example of an arrangement structure of an RF device provided to a wafer including a cavity.

FIG. 3 illustrates an example of an arrangement structure of an RF device provided to a wafer including a cavity.

Referring to FIG. 3, the cavity may be formed on both sides of the wafer by, for example, etching a top surface and bottom surface of the wafer to a predetermined depth. Also referring to FIG. 3, the cavity may be formed on a single side of the wafer by, for example, etching a single surface, either the top surface or the bottom surface, of the wafer to a predetermined depth.

The arrangement structure of the RF device provided to the wafer including the formed cavity may be classified as a double-sided cavity and single-sided device structure, a double-sided cavity and double-sided device structure, or a single-sided cavity and single-sided device structure.

The double-sided cavity and single-sided device structure may correspond to a structure in which an RF device 310 is disposed in the cavity formed on one surface, such as the top surface as illustrated in FIG. 3, of the wafer in an example in which the cavity is formed on both surfaces of the wafer.

The double-sided cavity and double-sided device structure may correspond to a structure in which an RF device 320 is disposed in the cavity formed on both surfaces of the wafer in an example in which the cavity is formed on both surfaces of the wafer. Since two RF devices may be disposed in a single wafer, the double-sided cavity and double-sided device structure may be used for lowering a layered height of the wafer and enhancing an integration efficiency of the RF device.

The single-sided cavity and single-sided device structure may correspond to a structure in which an RF device 330 is disposed in a cavity formed on a single surface of the wafer in an example in which the cavity is formed on the single surface of the wafer.

The cavity in a predetermined portion of the wafer may be formed at a depth deeper than a depth of the RF device in consideration of a thickness of the RF device to be disposed in the cavity. The location setting of the RF device on a single surface or both surfaces of the wafer may be set in consideration of interference between devices in an RF region.

Although the example configurations illustrated in FIG. 3 each have identical structures as being adjacent to one another, it is understood that the configurations are not limited to those illustrated. For example, a double-sided cavity and single-sided device structure may be provided adjacent to a double-sided cavity and double-sided device structure or a single-sided cavity and single-sided device structure, and a double-sided cavity and double-sided device structure may be provided adjacent to a single-sided cavity and single-sided device structure, and so on.

A bonding 340 between wafers may be formed using, for example, an eutectic bonding, a ball grid array bonding, a fusion bonding, a polymer bonding, and the like.

Figure 4:
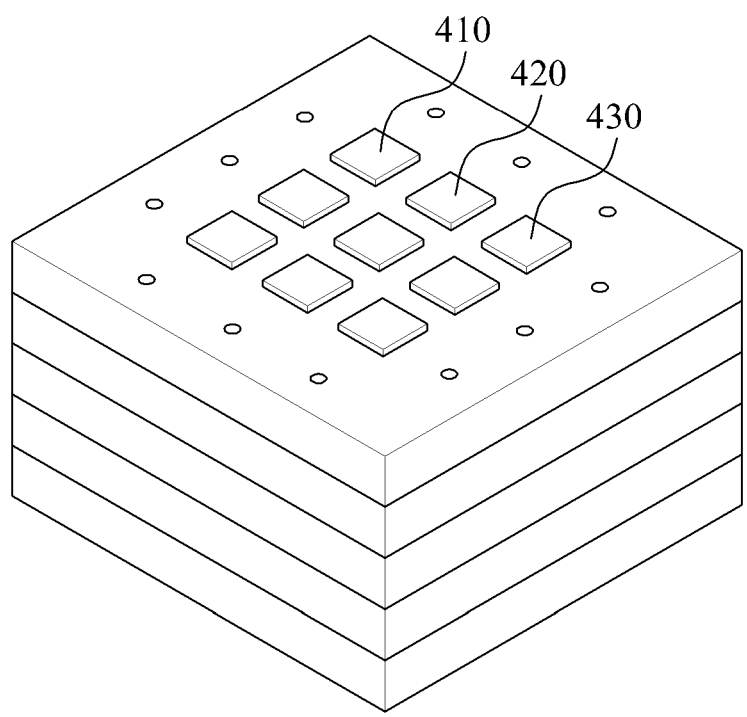
FIG. 4 illustrates an example of a multi-array RF layered module using a 3D vertical wiring.

FIG. 4 illustrates an example of a multi-array RF layered module using a 3D vertical wiring.

Referring to FIG. 4, a wafer constituting the RF layered module using the 3D vertical wiring may form multiple arrays on a single wafer including a plurality of devices performing different RF functions. At least one RF device, e.g., the RF devices 410, 420, and 430 illustrated in FIG. 4, may be located on a flat wafer or a wafer including a cavity. The RF devices 410, 420, and 430, which may perform different functions, may be located on the single wafer to form the multiple arrays.

The multiple arrays may indicate a structure in which the RF devices 410, 420, and 430 are performing different functions and are disposed in parallel. For example, RF devices performing functions of an antenna, a transmitting filter, a receiving filter, and a duplex used for performing a function of a first transceiver may be located on a layer of the single wafer. RF devices performing functions of an antenna, a transmitting filter, a receiving filter, and a duplex used for performing a function of a second transceiver having a different frequency band or different communication scheme may be located on another layer of the single wafer, or on another wafer of the multi-array RF layered module.

A signal used for performing a function by the RF device may be transmitted using a vertical wiring connected through a via-hole. In an example in which the number of RF devices located on the single wafer increases, the number of via-holes formed on the wafer may increase in proportion to the increase of the number of RF devices.

Figure 5:
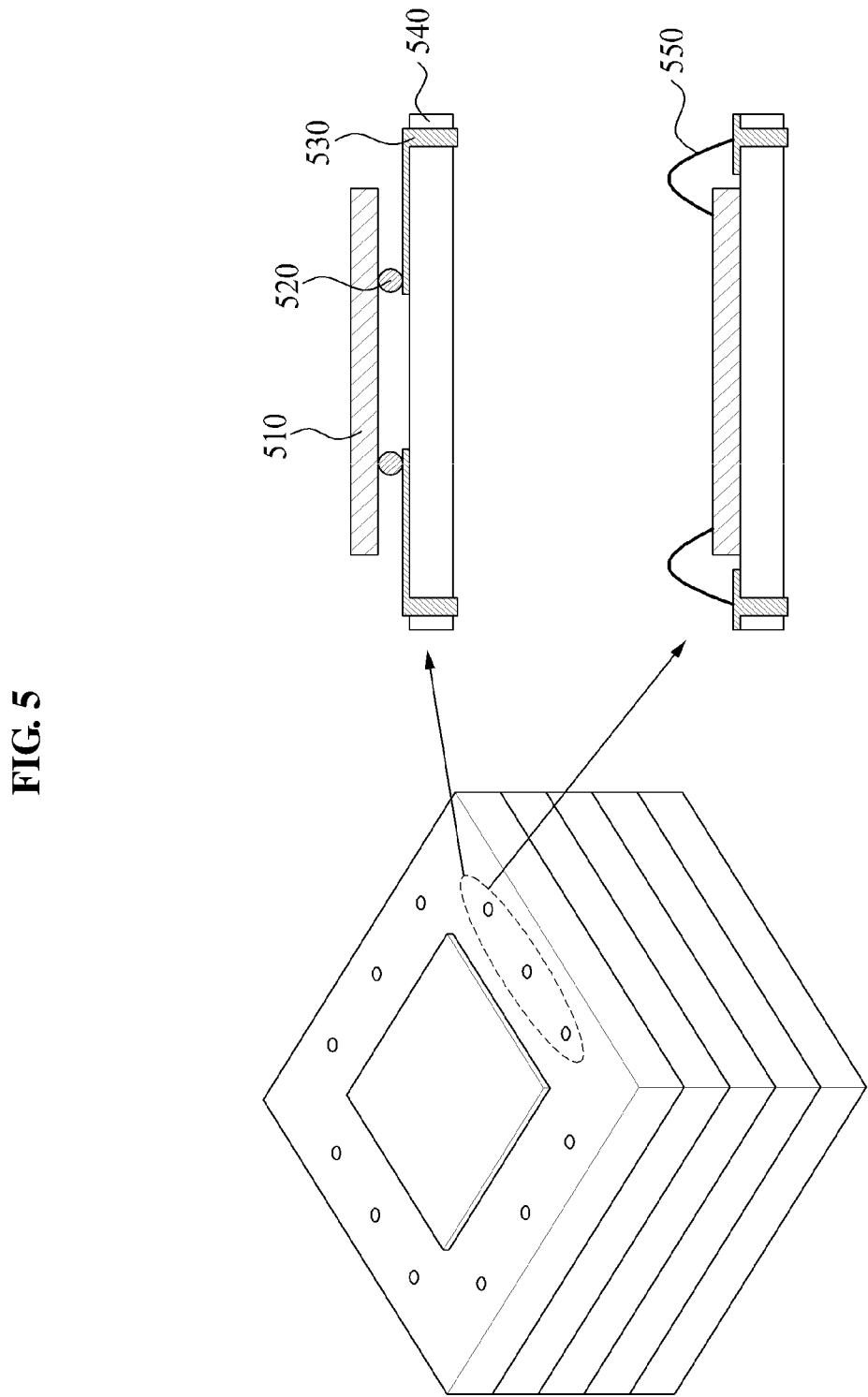
FIG. 5 illustrates an example of a scheme of connecting a wafer and an RF device in an RF layered module using a 3D vertical wiring.

FIG. 5 illustrates an example of a scheme of connecting a wafer and an RF device 510 in an RF layered module using a 3D vertical wiring.

Referring to the example illustrated in FIG. 5, the RF device 510 provided on the wafer may be connected to a via-hole through an electrode 530. Via holes in different wafers may be connected through a vertical wiring. The RF device 510 may be connected to the electrode 530 through, for example, a ball grid 520. More particularly, the RF device 510 may be connected to the electrode 530 by a ball grid array bonding. As another example, the RF device 510 may be connected to the electrode 530 through a wire 550. More particularly, the RF device 510 may be connected to the electrode 530 by a wire bonding.

Figure 6:
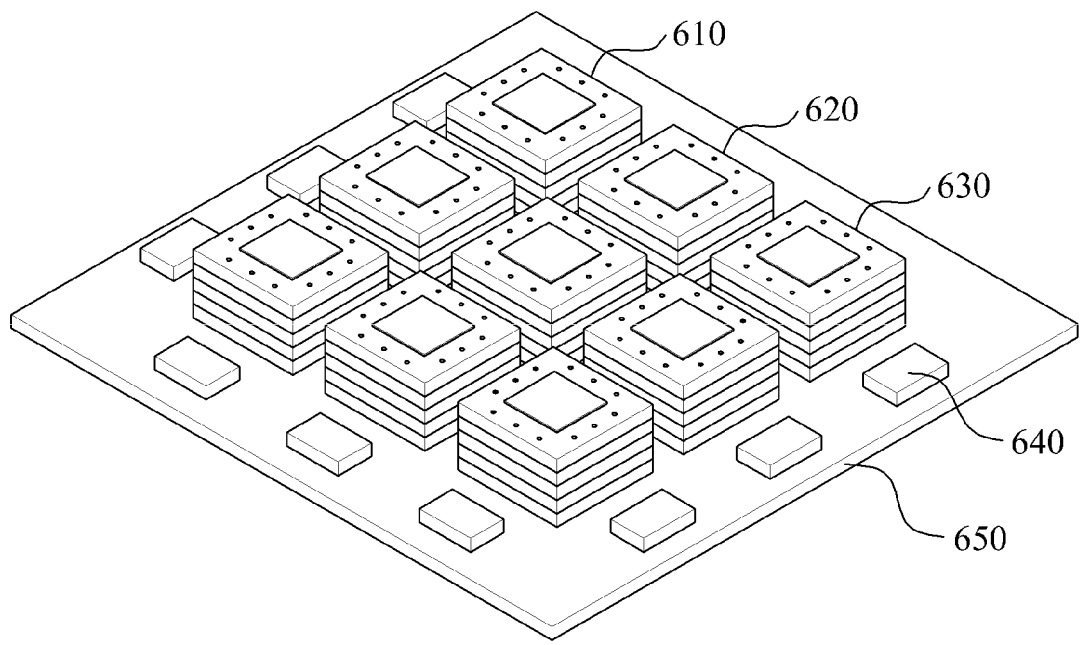
FIG. 6 illustrates another example of a multi-array RF layered module using a 3D vertical wiring.

FIG. 6 illustrates another example of a multi-array RF layered module using a 3D vertical wiring.

Referring to the example illustrated in FIG. 6, the multi-array RF layered module using the 3D vertical wiring may include at least one RF layered module using a plurality of 3D vertical wirings, an inductor or capacitor 640, and a multi-array substrate 650. For convenience of description, the at least one RF layered module illustrated in the example of FIG. 6 includes RF layered modules 610, 620, and 630. However, it is understood that the various possible configurations are not limited thereto.

The RF layered modules 610, 620, and 630 using the plurality of 3D vertical wirings may include a plurality of layered wafers, an RF device located on each of the wafers, a via-hole connecting the plurality of wafers through the vertical wiring, and a penetrating electrode connecting the via-hole and the multi-array substrate. Since the RF layered modules 610, 620, and 630 using the plurality of 3D vertical wirings may include a plurality of RF devices, various functions of the included RF devices may be performed.

For example, a respective first RF device included in the RF layered modules 610, 620, and 630 may correspond to a filter receiving a signal of a predetermined communication scheme, and a respective second RF device included in the RF layered modules 610, 620, and 630 may correspond to a filter receiving a signal of another predetermined communication scheme. It is understood that the two functions described here are merely two examples of the various functions which may be performed by various RF devices, and various examples are not limited thereto.

In an example in which a communication scheme of a device changes, the same device may receive a signal transmitted by the changed communication scheme because of the RF layered modules which are capable of operating with different communication schemes. The device may correspond to a terminal including the RF layered modules 610, 620, and 630, a laptop computer including the RF layered modules 610, 620, and 630, or any similar electrical device using a wireless mobile communication.

In the RF layered modules 610, 620, and 630 using the 3D plurality of vertical wiring, the via-hole may be formed on the wafer, and two or more of the wafers may be vertically connected. The 3D vertical wiring may be connected to the multi-array substrate 650 through the penetrating electrode located on the lowest bottom surface or the highest top surface of the RF layered modules 610, 620, and 630.

The inductor or capacitor 640 may be used for eliminating noise, impedance matching, controlling interference between RF layered modules, and so on.

The multi-array substrate 650 may correspond to a substrate on which the RF layered modules 610, 620, and 630 using the plurality of 3D vertical wiring is layered, and RF devices performing different functions may be layered with a high degree of integration.

A plurality of RF devices may be disposed on the wafer included in the multi-array RF layered module using the 3D vertical wiring. Multiple arrays may be formed by disposing the plurality of RF devices on the wafer. By forming the multiple arrays, a degree of integration of the RF devices performing different functions may be enhanced.

A multi-array RF layered module disposing method may include layering a first wafer on a top side of a multi-array substrate including, for example, an inductor or capacitor, layering at least one first RF device on at least one side, such as a top side, of the first wafer, and forming at least one first via-hole proximate to the at least one first RF device. A second wafer may be layered on the top side of the first wafer, at least one second RF device may be layered on at least one side, such as a top side, of the second wafer, and at least one second via-hole may be formed at a location corresponding to the at least one first via-hole. The second via-hole may be formed after the at least one first via-hole is formed, or the at least one first via-hole may be formed at a location corresponding to the at least one second via-hole at the same time or after the at least one second via-hole is formed. The at least one first via-hole and the at least one second via-hole may be connected, and a penetrating electrode connected to an external device through a bottom surface of the at least one first via-hole or a top surface of the at least one second via-hole may be formed. Thus, a first RF layered module performing a function of the first RF device and/or the second RF device may be layered on a top side of the multi-array substrate.

A third wafer may be layered on the top side of the multi-array substrate, at least one third RF device may be layered on at least one side, such as a top side, of the third wafer, and at least one third via-hole may be formed proximate to the third RF device. A fourth wafer may be layered on the top side of the third wafer, at least one fourth RF device may be layered on at least one side, such as a top side, of the fourth wafer, and at least one fourth via-hole may be formed at a location corresponding to the at least one third via-hole. The at least one fourth via-hole may be formed after the at least one third via-hole is formed, or the at least one third via-hole may be formed at a location corresponding to the at least one fourth via-hole at the same time or after the at least one fourth via-hole is formed. The at least one third via-hole and the at least one fourth via-hole may be connected, and a penetrating electrode connected to an external device through a bottom surface of the at least one third via-hole or a top surface of the at least one fourth via-hole may be formed. Thus, a second RF layered module performing a function of the third RF device and/or the fourth RF device may be layered on the multi-array substrate.

It is understood that the top side referred to in regard to the multi-array substrate simply refers to the orientation of the multi-array substrate illustrated in FIG. 6, and is described as such for the sake of simplicity in this example. It is further understood that one or more RF layered modules may be provided on either or both sides of the multi-array substrate.

FIG. 7 illustrates an example of a wiring connecting scheme among a plurality of RF layered modules 710, a multi-array substrate 750, and a circuit substrate, using a 3D vertical wiring.

Referring to FIG. 7, the plurality of RF layered modules 710 using the 3D vertical wiring may be connected to the multi-array substrate 750. In this example, a first connecting portion 730 connecting the plurality of RF layered modules 710 and the multi-array substrate 750 may be connected using, for example, a flip chip or ball grid array scheme. Via-holes 720, 722, 724, 726, and 728 may be formed on each wafer included in the plurality of RF layered modules 710 using the 3D vertical wiring, and a penetrated electrode located on a bottom surface of a lowest wafer of the RF layered modules 710 may be connected to the multi-array substrate 750 through the first connecting portion 730.

The via-holes 720, 722, 724, 726, and 728 formed on each wafer, and a penetrated electrode located on a top surface of a highest wafer of the RF layered modules 710, may be connected to the multi-array substrate 750 through the first connecting portion 730.

The multi-array substrate 750 may be disposed on a top side of the highest wafer of the RF layered modules 710. Accordingly, an RF device may be connected to the multi-array substrate 750 of the top side by the 3D vertical wiring through the via-hole and a second connecting portion 740 to receive a signal used for performing one or more functions.

The multi-array substrate 750 and the circuit substrate including an inductor or capacitor may be connected by a third connecting portion 760. The third connecting portion 760 may connect the multi-array substrate 750 and the circuit substrate using, for example, the flip chip or ball grid array scheme.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A radio frequency (RF) layered module using three dimensional (3D) vertical wiring, the RF layered module comprising:
   a first wafer provided with a first RF device and a plurality of via holes;
   a second wafer provided with a second RF device and a plurality of via holes which are disposed at locations corresponding to locations of the plurality of via holes of the first wafer;
   a plurality of penetrating electrodes configured to be connected to an external device through a bottom surface of the plurality of via holes of the first wafer or a top surface of the plurality of via holes of the second wafer; and
   a plurality of vertical wirings comprising a first vertical wiring connecting only the first RF device, but not the second RF device, to a first penetrating electrode through a first via hole of each of the first and second wafers, and a second vertical wiring connecting only the second RF device, but not the first RF device, to a second penetrating electrode through a second via hole of each of the first and second wafers.

2. The RF layered module of claim 1, further comprising: a first electrode connecting the first via-hole of the first wafer and the first RF device.

3. The RF layered module of claim 1, wherein:
a top surface of the first wafer has a flat structure, and
the first RF device is disposed on the top surface of the first wafer.

4. The RF layered module of claim 1, wherein:
a top surface of the first wafer has a cavity formed in a predetermined portion, and
the first RF device is disposed in the cavity.

5. The RF layered module of claim 1, wherein:
a top surface and a bottom surface of the first wafer each have a cavity formed in a predetermined portion, and
the first RF device is disposed in the cavity formed on the top surface.

6. The RF layered module of claim 1, wherein:
a top surface and a bottom surface of the first wafer each have a cavity formed in a predetermined portion,
the first RF device is disposed in the cavity formed on the top surface, and
a third RF device is disposed in the cavity formed on the bottom surface.

7. The RF layered module of claim 1, wherein the first wafer is provided with a plurality of RF devices performing different RF functions, and forming multiple arrays on the first wafer.

8. The RF layered module of claim 1, wherein the first wafer and the second wafer are coupled using a eutectic bonding, a ball grid array bonding, a fusion bonding, a polymer bonding, or any combination thereof.

9. The RF layered module of claim 2, further comprising:
a ball grid connecting the first RF device and the first electrode,
wherein the first electrode is disposed on a top side of the first wafer.

10. The RF layered module of claim 2, further comprising:
a wire connecting the first RF device and the first electrode,
wherein the first electrode is disposed on a top side of the first wafer.

* * * * *